United States Patent
Chen et al.

(10) Patent No.: US 6,713,362 B1
(45) Date of Patent: Mar. 30, 2004

(54) METHOD FOR FORMING A RESISTOR TO REPLACE A N-WELL RESISTOR

(75) Inventors: Chih-Hung Chen, Hsin-Chu (TW); Sung-Dtr Wu, Taichung (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 10/330,241

(22) Filed: Dec. 30, 2002

(51) Int. Cl.[7] .................................. H01L 27/02
(52) U.S. Cl. ....................... 438/382; 438/385
(58) Field of Search ................ 438/238, 381–385

(56) References Cited

U.S. PATENT DOCUMENTS 5,622,884 A * 4/1997 Liu ......................... 438/238
6,492,240 B1 * 12/2002 Wang et al. ............. 438/382

* cited by examiner

Primary Examiner—H. Jey Tsai
(74) Attorney, Agent, or Firm—Nath & Associates PLLC; Harold L. Novick; Marvin C. Berkowitz

(57) ABSTRACT

The present invention relates to a method for forming a non-salicide $p^+$ polysilicon resistor used to replace a N-well resistor. In the low power SRAM process whose window is lower than 0.15 μm, it is found that non-salicide $p^+$ polysilicon resistor has minor temperature dependence and also has layout benefit. In addition, the non-salicide p+ polysilicon resistor is decreased at high temperature. Therefore, it is good benefit to reduce the RC timing delay, which would compensate the inherent MOS mobility deceleration at high temperature, when the non-salicide $p^+$ polysilicon resistor of the present invention is used to replace the N-well resistor.

9 Claims, 5 Drawing Sheets

METHOD FOR FORMING A RESISTOR TO REPLACE A N-WELL RESISTOR

BACKGROUND OF THE INVENTION

1. Field of the Invention

The present invention generally relates to a method for forming a non-salicide $p^+$ polysilicon resistor to replace the N-well resistor in semiconductor manufacture procedure to reduce the RC timing delay.,

2. Description of the Prior Art

A static random access memory (SRAM) is widely used in integrated circuits, and plays an especially important role in the electronic industry. The unanimous target for the industries is to fabricate a device with reduced dimensions and high quality. A load resistor is one of the devices that constitute a SRAM cell and is usually made of lightly doped or undoped polysilicon.

Many semiconductor devices and integrated circuits are designed to operate over wide temperature ranges. For example, circuits may be specified to perform correctly at all temperatures in a given temperature range. In some application this range may be rather large, for example from as low as −50° C. or lower up to 125° C. or possibly even higher.

In semiconductor physics, the mobility is a measure of the ease of carrier motion within a semiconductor structure. A low mobility implies the carriers inside the semiconductor are suffering a relatively large number of motion-impeding collisions. A large mobility, on the other hand, implies the carriers are zipping along with comparative ease. As is known, the resistivity is inversely proportional to the mobility. In other words, as the mobility goes up, the resistivity will go down; and as the mobility goes down, the resistivity will go up.

The mobilities and resistivities of semiconductor structures will depend upon the temperature, doping concentrations and other factors. In very low doped samples, for example, carrier mobilities monotonically decrease as the temperature is increased. For higher sample dopings, however, the temperature dependence becomes increasingly more complex.

Referring to FIG. 1, a NAND 10 is connected to a transducer. A N-well resistor 12 which is connected between NAND 10 and metal ($R_M$) 14, and capacitor 16. The capacitor 16 is connected device 18. The device comprises high speed device such as static random access memory (SRAM).

N-well resistance is widely used in circuit design and has some advantages such as layout benefit Unfortunately, it has apparent temperature dependence and increases RC delay time with temperature.

For the forgoing reasons, there is a necessary for a resistor for replacing N-well resistor. It would obtain good benefit to reduce the RC delay that would compensate the inherent MOS mobility deceleration at high temperature.

SUMMARY OF THE INVENTION

In accordance with the present invention, the present invention provides a non-salicide $p^+$ polysilicon resistor used to replace a N-well resistor to solve problems in resistor capacitance (RC) corresponding to the temperature in the traditional procedures.

The second object of the present invention is to decrease temperature dependence of the resistor and to get better layout benefit by using a non-salicide $p^+$ polysilicon resistor to replace a N-well resistor.

The third object of the present invention is to decrease a resistance at high temperature by using a non-salicide $p^+$ polysilicon resistor to replace a N-well resistor.

The further object of the present invention is to reduce the RC timing delay, which compensates the inherent MOS mobility deceleration at high temperature, by using a non-salicide $p^+$ polysilicon resistor to replace a N-well resistor.

In order to achieve the above object, the present invention provides a method for forming a non-salicide $p^+$ polysilicon resistor used to replace a N-well resistor to solve problems in resistor capacitance corresponding to the temperature in the traditional procedures. At first, the present invention provides a substrate, wherein a material of the substrate is polysilicon. Then $p^+$ ions are implanted into the substrate to form a $p^+$ polysilicon resistor in the substrate, wherein the $p^+$ ions belong to III group elements and comprise boron ions. In the implanting $p^+$ ions procedure, a dosage of $p^+$ ions is about $2\times10^{15} cm^{-2}$ to $4\times10^{15} cm^{-2}$ and an energy of the implanted $p^+$ ions is about 12 kev to 13 kev. Because there is no salicide layer on the $p^+$ polysilicon resistor region, the $p^+$ polysilicon resistor of the present invention is a non-salicide $p^+$ polysilicon resistor. Using the non-salicide $p^+$ polysilicon resistor of the present invention can decrease temperature dependence of the resistor and get better layout benefit. Using the non-salicide $p^+$ polysilicon resistor of the present invention can also decrease a resistance at high temperature. Using the non-salicide $p^+$ polysilicon resistor of the present invention can further reduce the RC timing delay, which compensates the inherent MOS mobility deceleration at high temperature.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

Figure 1:
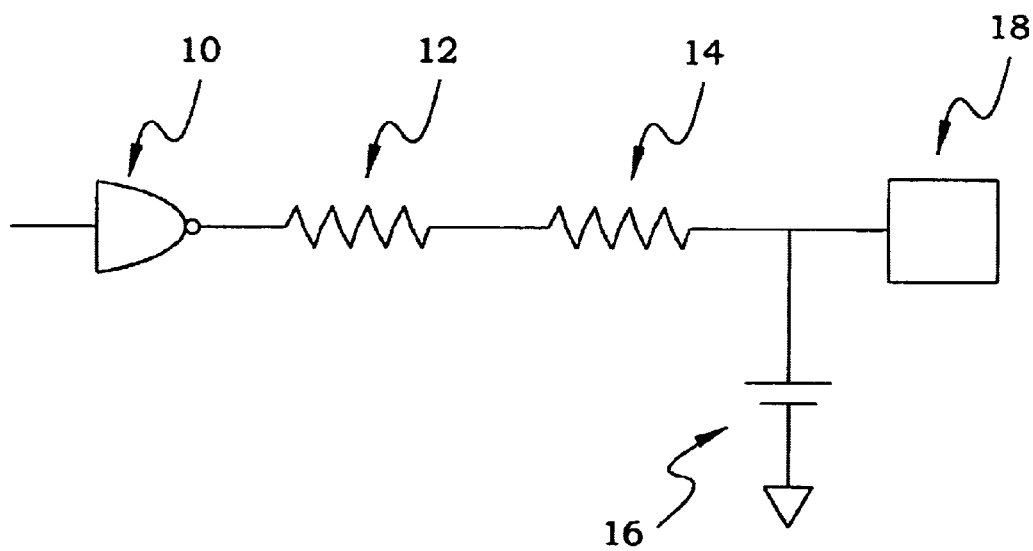
FIG. 1 shows a N-well resistor in the prior art.
Figure 2A:
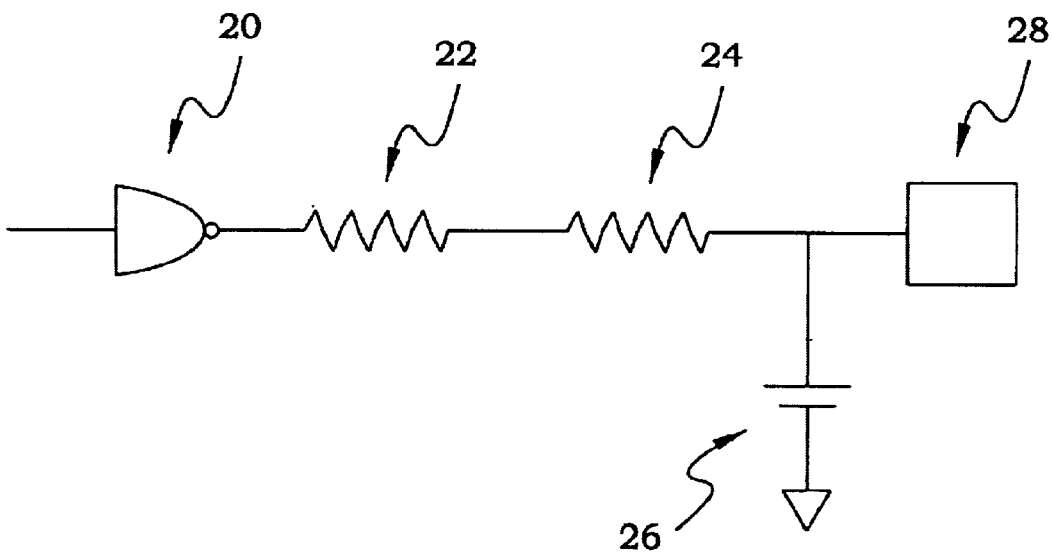
FIG. 2A shows a diagram in replacing a N-well resistor by using the non-salicide $p^+$ polysilicon resistor of the present invention.

Referring to FIG. 2A, this shows a diagram in replacing a N-well resistor by using the non-salicide $p^+$ polysilicon resistor of the present invention. A NAND 20 is connected to a transducer. A non-salicide $p^+$ polysilicon resistor 22 which is located between NAND 20 and metal ($R_M$) 24. The capacitor 26 is used to connect the device 28 and the metal 24, wherein the device comprises high speed device such as static random access memory (SRAM). Because the non-salicide $p^+$ polysilicon resistor 22 of the present invention is used to replace the N-well resistor to avoid defects in the MOSFET due to the temperature effects, wherein the N-well resistor is usually formed in the substrate, the $p^+$ polysilicon resistor of is formed by providing a polysilicon substrate at first and then implanting $p^+$ ions into the polysilicon substrate. The $p^+$ polysilicon resistor of the present invention is called non-salicide $p^+$ polysilicon resistor because the salicide layer is not formed on the $p^+$ polysilicon resistor. In the implanting $p^+$ ions procedure, the $p^+$ ions belong to III group elements and comprise boron ions. A dosage of $p^+$ ions is about $2\times10^{15} \text{cm}^{-2}$ to $4\times10^{15} \text{cm}^{-2}$ and an energy of the implanted $p^+$ ions is about 12 kev to 13 kev.

Following description is one embodiment of the present invention and a scope of the present invention is not limited.

Figure 2B:
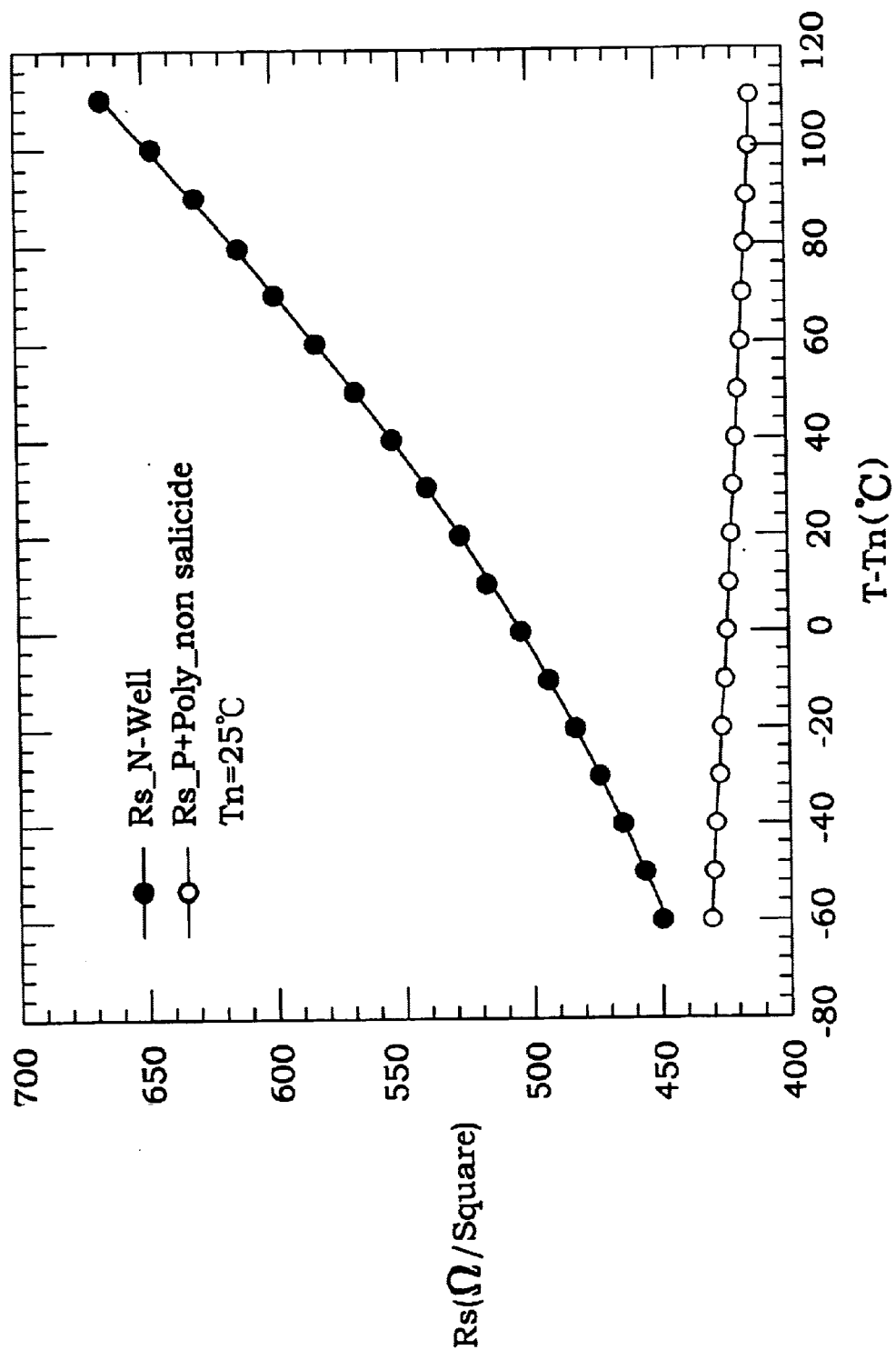
FIG. 2B shows a relationship diagram between a variation temperature and a resistance in showing a comparing result between a N-well resistor and a non-salicide $p^+$ polysilicon resistor.

Referring to FIG. 2B, this shows a relationship diagram between a variation temperature and a resistance in showing a comparing result between a N-well resistor and a non-salicide $p^+$ polysilicon resistor. Because the non-salicide $p^+$ polysilicon resistor of the present invention can reach the efficiency of the N-well resistor completely in the MOSFET and the resistance of the present invention will not be increased with a wide margin following increased temperature, the non-salicide $p^+$ polysilicon resistor of the present invention can be used to replace the N-well resistor successfully in the circuit arrangement procedure. In the FIG. 2B, the test product is an ultra-low-power static random access memory (LPSRAM) and the room temperature is about 25° C. The vertical axis of the diagram expresses the resistance and the cross axis of the diagram expresses difference value between the temperature of the resistor and the room temperature. The sign "●" shows the result of the N-well resistor used in the low power SRAM in the relationship diagram between the variation temperature and the resistance. The sign "○" shows the result of the non-salicide $p^+$ polysilicon resistor of the present invention used in the low power SRAM in the relationship diagram between the variation temperature and resistance. From FIG. 2B, the information is known that the resistance is increased with a wide margin following increased temperature when the N-well resistor is used in the low power SRAM. This condition will increase the RC timing delay and decrease qualities of the semiconductor elements. The resistance is decreased with a narrow margin following increased temperature when the non-salicide $p^+$ polysilicon resistor is used in the low power SRAM. This condition will decrease the RC timing delay and increase qualities of the semiconductor elements.

Figure 2C:
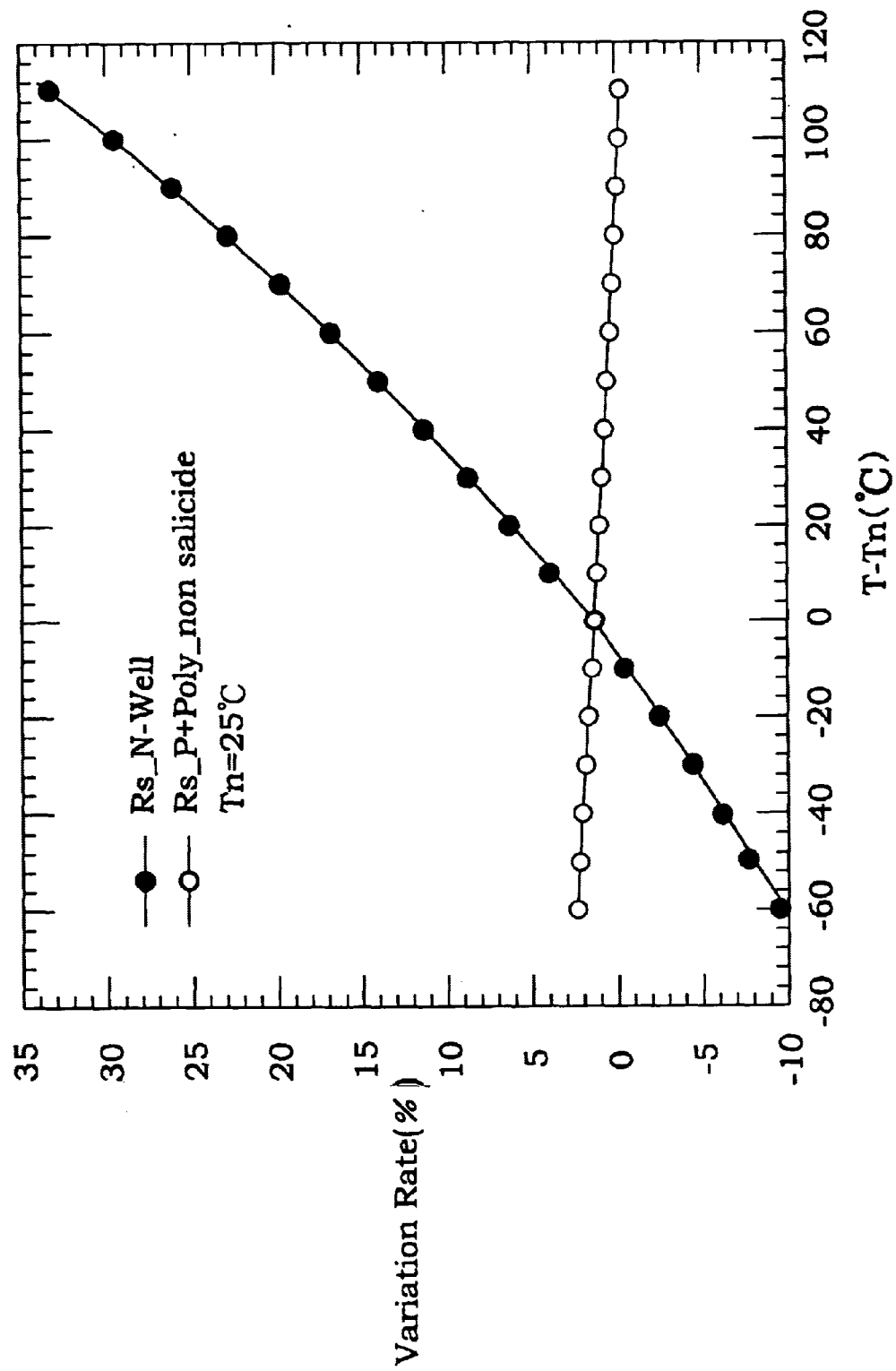
FIG. 2C shows a relationship diagram between a variation temperature and a resistance variation rate in showing a comparing result between a N-well resistor and a non-salicide $p^+$ polysilicon resistor.

FIG. 2C shows a relationship diagram between a variation temperature and a resistance variation rate in showing a comparing result between a N-well resistor and a non-salicide $p^+$ polysilicon resistor. In the FIG. 2C, the test product is an ultra-low-power static random access memory (LPSRAM) and the room temperature is about 25° C. The vertical axis of the diagram expresses the resistor variation rate (%) and the cross axis of the diagram expresses difference value between the temperature of the resistor and the room temperature. The sign Mew shows the result of the N-well resistor used in the low power SRAM in the relationship digram between the variation temperature and the resistor variation rate. The sign "○" shows the result of the non-salicide $p^+$ polysilicon resistor of the present invention used in the low power SRAM in the relationship diagram between the variation temperature and the resistor variation rate. From FIG. 2C, if the N-well resistor is used in the low power SRAM, the information is known that the resistor variation rate is about 44% when the variation temperature from −35° C. to become 135° C. If the non-salicide $p^+$ polysilicon resistor of the present invention is used in the low power SRAM, the resistor variation rate is about 4.5% when the variation temperature from −35° C. to become 135° C. Because the amount of the variation rate of the non-salicide $p^+$ polysilicon resistor is smaller than the amount of the variation rate of the N-well resistor at the same range variation temperature, the non-salicide $p^+$ polysilicon resistor will decrease the RC timing delay and increase qualities of the semiconductor elements.

Figure 3A:
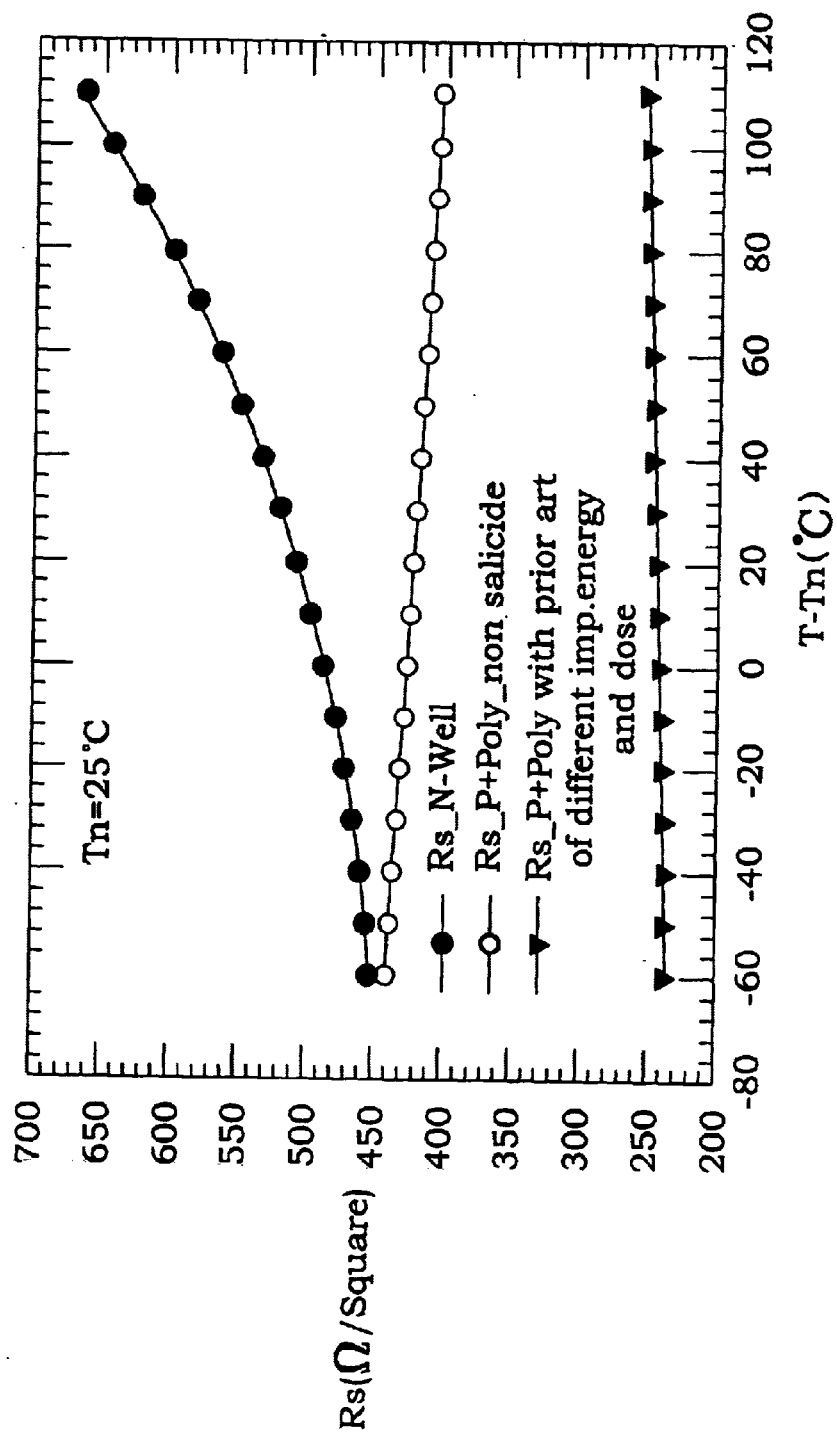
FIG. 3A shows a relationship diagram between a variation temperature and a resistance in showing a comparing result among a N-well resistor, a traditional $p^+$ polysilicon resistor, and a non-salicide $p^+$ polysilicon resistor.

Referring to FIG. 3A, this shows a relationship diagram between a variation temperature and a resistance in showing a comparing result among a N-well resistor, a traditional $p^+$ polysilicon resistor, and a non-salicide $p^+$ polysilicon resistor. The dosage of the $p^+$ ions in the traditional $p^+$ polysilicon resistor is about $2\times10^{15}\text{cm}^{31\ 2}$ to $3\times10^{15}\text{cm}^{-2}$ and the energy of the $p^+$ ions in the forming traditional $p^+$ polysilicon resistor process is about 14 kev to 15 kev. In the FIG. 3A, the test product is an ultra-low-power static random access memory (LPSRAM) and the room temperature is about 25° C. The vertical axis of the diagram expresses the resistance and the cross axis of the diagram expresses difference value between the temperature of the resistor and the room temperature. The sign "●" shows the result of the N-well resistor used in the low power SRAM in the relationship diagram between the variation temperature and the resistance. The sign "▼" shows the result of the traditional $p^+$ polysilicon resistor used in the low power SRAM in the relationship diagram between the variation temperature and the resistance. The sign "○" shows the result of the non-salicide $p^+$ polysilicon resistor of the present invention used in the low power SRAM in the relationship diagram between the variation temperature and the resistance. From FIG. 3A, the information is known that the resistance is increased with a wide margin following increased temperature when the N-well resistor is used in the low power SRAM. The resistance is increased with a narrow margin following increased temperature when the traditional $p^+$ polysilicon resistor is used in the low power SRAM. This increased resistance condition will increase the RC timing delay and decrease qualities of the semiconductor elements. The resistance is decreased with a narrow margin following increased temperature when the non-salicide $p^+$ polysilicon resistor is used in the low power SRAM. This condition will decrease the RC timing delay and increase qualities of the semiconductor elements. From FIG. 3A, the information is known that different dosage and different implanting energy still affect the resistance of the $p^+$ polysilicon resistor at the same temperature even though forming p⁺ polysilicon resistor is a prior art. Therefore, when the non-salicide p⁺ polysilicon resistor is formed by using dosage and implanting energy of the present invention, the RC timing delay, which compensates the inherent MOS mobility deceleration at high temperature, is reduced.

Figure 3B:
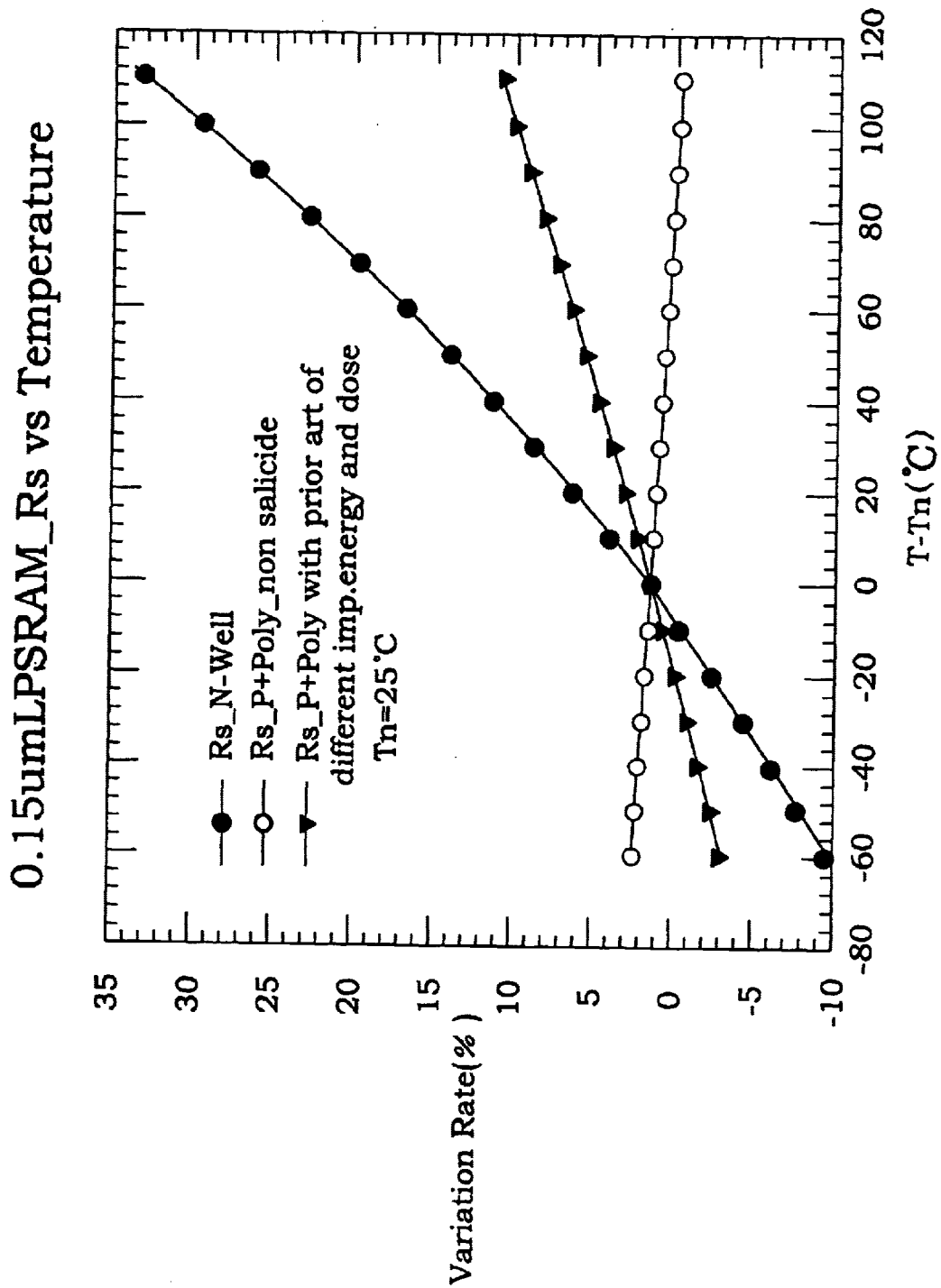
FIG. 3B shows a relationship diagram between a variation temperature and a resistance variation rate in showing a comparing result among a N-well resistor, a traditional $p^+$ polysilicon resistor, and a non-salicide $p^+$ polysilicon resistor.

Referring to FIG. 3B, this shows a relationship diagram between a variation temperature and a resistance variation rate in showing a comparing result among a N-well resistor, a traditional p⁺ polysilicon resistor, and a non-salicide p⁺ polysilicon resistor. In the FIG. 3B, the test product is an ultra-low-power static random access memory (LPSRAM) and the room temperature is about 25° C. The vertical axis of the diagram expresses the resistance variation rate and the cross axis of the diagram expresses difference value between the temperature of the resistor and the room temperature. The sign "●" shows the result of the N-well resistor used in the low power SRAM in the relationship diagram between the variation temperature and the resistance variation rate. The sign "▼" shows the result of the traditional p⁺ polysilicon resistor used in the low power SRAM in the relationship diagram between the variation temperature and the resistance variation rate. The sign "●" shows the result of the non-salicide p⁺ polysilicon resistor of the present invention used in the low power SRAM in the relationship diagram between the variation temperature and variation resistor rate. From FIG. 3B, if the N-well resistor is used in the low power SRAM, the information is known that the resistor variation rate is about 44% when the variation temperature from −35° C. to become 135° C. If the traditional p⁺ polysilicon resistor is used in the low power SRAM, the information is known that the resistor variation rate is about 14% when the variation temperature from −35° C. to become 135° C. used in the low power SRAM, the resistor variation rate is about 4.5% when the variation temperature from −35° C. to become 135° C. Because the amount of the variation rate of the non-salicide p⁺ polysilicon resistor is smaller than the amount of the variation rate of the N-well resistor or the traditional p⁺ polysilicon resistor at the same range variation temperature, the non-salicide p⁺ polysilicon resistor will decrease the RC timing delay and increase qualities of the semiconductor elements. From FIG. 3B, the information is known that different dosage and different implanting energy still affect the resistance of the p⁺ polysilicon resistor at the same temperature even though forming p⁺ polysilicon resistor is a prior art. Therefore, when the non-salicide p⁺ polysilicon resistor is formed by using dosage and implanting energy of the present invention, the RC timing delay, which compensates the inherent MOS mobility deceleration at high temperature, is reduced.

In accordance with the present invention, the present invention provides a method for forming a non-salicide p⁺ polysilicon resistor used to replace a N-well resistor to solve problems in resistor capacitance corresponding to the temperature in the traditional procedures. At first, the present invention provides a substrate, wherein a material of the substrate is polysilicon. Then p⁺ ions are implanted into the substrate to form a p⁺ polysilicon resistor in the substrate, wherein the p⁺ ions belong to III group elements and comprise boron ions. In the implanting p⁺ ions procedure, a dosage of p⁺ ions is about $2 \times 10^{15} cm^{-2}$ to $4 \times 10^{15} cm^{-2}$ and energy of the implanted p⁺ ions is about 12 kev to 13 kev. Because there is no salicide layer on the p⁺ polysilicon resistor region, the p⁺ polysilicon resistor of the present invention is a non-salicide p⁺ polysilicon resistor. Using the non-salicide p⁺ polysilicon resistor of the present invention can decrease temperature dependence of the resistor and get better layout benefit. Using the non-salicide p⁺ polysilicon resistor of the present invention can also decrease a resistance at high temperature. Using the non-salicide p⁺ polysilicon resistor of the present invention can further reduce the RC timing delay, which compensates the inherent MOS mobility deceleration at high temperature.

Although specific embodiments have been illustrated and described, it will be obvious to those skilled in the art that various modifications may be made without departing from what is intended to be limited solely by the appended claims.

What is claimed is:

1. A method for forming a resistor to replace a N-well resistor, said method comprising:

providing a substrate;

implanting ions into said substrate to form a resistor region therein, wherein an implanting energy of said ions is about 12 kev to 13 kev, a dosage of said ions is about $2 \times 10^{15} cm^{-2}$ to $4 \times 10^{15} cm^{-2}$, and said ions belong to III group elements; and forming a salicide layer on said substrate, wherein said salicide layer is not formed on said resistor region.

2. The method according to claim 1, wherein said resistor is applied high-speed device.

3. The method according to claim 2, wherein said high-speed device is static random access memory (SRAM).

4. The method according to claim 1, wherein said elements of III group comprise boron (B).

5. The method according to claim 1, wherein said substrate is a polysilicon substrate.

6. A method for forming a resistor to replace N-well resistor, said method comprising:

providing a substrate, wherein said substrate is a polysilicon substrate;

implanting ions into said substrate to form a non-salicide p+ polysilicon resistor therein, wherein an implanting energy of said ions is about 12 kev to 13 kev dosage of said ions is about $2 \times 10^{15} cm^{-2}$ to $4 \times 10^{15} cm^{-2}$, and said ions belong to III group elements; and forming a salicide layer on said substrate, wherein said salicide layer is not formed on said non-salicide p⁺ polysilicon resistor.

7. The method according to claim 6, wherein said resistor is applied high-speed device.

8. The method according to claim 7, wherein said high-speed device is static random access memory (SRAM).

9. The method according to claim 6, wherein a material of said ions is boron.

* * * * *